United States Patent [19]

Bailey et al.

[11] Patent Number: 4,714,875
[45] Date of Patent: Dec. 22, 1987

[54] PRINTED CIRCUIT BOARD FAULT LOCATION SYSTEM

[75] Inventors: John W. Bailey; Paul A. Hayter; Brian R. Mason; Graham N. Turner, all of Berkshire, England

[73] Assignee: Mars, Inc., McLean, Va.

[21] Appl. No.: 722,406

[22] Filed: Apr. 12, 1985

[30] Foreign Application Priority Data

Apr. 16, 1984 [GB] United Kingdom ............... 8409794
Mar. 29, 1985 [GB] United Kingdom ............... 8508319

[51] Int. Cl.$^4$ .................... G01R 31/28; G01R 31/02
[52] U.S. Cl. .......................... 324/73 PC; 324/73 R; 324/158 F
[58] Field of Search ........... 324/73 PC, 73 R, 73 AT, 324/158 R, 158 F

[56] References Cited

U.S. PATENT DOCUMENTS 4,225,819  9/1980  Grau ............................ 324/73 PC
4,342,958  8/1982  Russell ......................... 324/73 R

FOREIGN PATENT DOCUMENTS 72317    4/1985  Japan ........................... 324/73 AT
766935   1/1957  United Kingdom .
850061   9/1960  United Kingdom .
994220   6/1965  United Kingdom .
1263644  2/1972  United Kingdom .
1328831  9/1973  United Kingdom .

OTHER PUBLICATIONS

Faran, J. J.; "Methods of Assignment ..."; IEEE 1982 Test Conference; May 1982; pp. 641–647.

Primary Examiner—Ernest F. Karlsen
Attorney, Agent, or Firm—Davis Hoxie Faithfull & Hapgood

[57] ABSTRACT

An in-circuit testing apparatus (manufacturing defects analyzer) for the determination of manufacturing defects in an electrical circuit board such as short circuits, tracking faults, mininserted omitted and out-of tolerance components etc., and not for effecting full functional testing of the circuit board, comprises an array of bidirectionally current conducting analog switching networks each of which defines a test point for connection to a node of a circuit board and connectable, under software control of the respective switchng network, either to a stimulus source or to a reference (e.g. ground) potential and simultaneously also to an input of a measurement facility. A resistor, capacitor, inductor or other circuit component can be connected between the test points defined by two of the switching networks and can thus be subjected to an appropriate stimulus and its response measured and analyzed for determining the viability of the respective component. A modified form of the apparatus enables the gain of discrete transistors also to be monitored. A desk-top form of the apparatus has a recess in its main housing for receiving an interchangeable board-probing module which is customized to a particular board to be tested and has a customized probe array coupled to one part of a universal interface connector, the other part of the universal interface connector being provided in the recess in the main housing such that the two parts come together when the module is inserted into the housing recess.

21 Claims, 9 Drawing Figures

PRINTED CIRCUIT BOARD FAULT LOCATION SYSTEM

This invention generally concerns an improved testing apparatus and more particularly concerns a so-called in-circuit testing apparatus for the testing of electrical components assembled on a printed circuit board for example without necessitating removal or disconnection of the respective components from the printed circuit board.

A number of different types of sophisticated and expensive systems are available for the testing of completed printed circuit board assemblies of electrical components. One type is adapted for functional testing by application to inputs of the powered-up printed circuit board assembly of test signals and sequences thereof formulated to enable the functional operation of the assembly to be monitored by monitoring of corresponding signals obtained from outputs and other test nodes of the assembly. Another type, sometimes called an in-circuit tester, is adapted not so much for functional testing of the overall circuit board assembly as for the determination of manufacturing defects such as short circuits, tracking faults, mis-inserted and/or missing and/or out of tolerance components, and the function of individual integrated circuits, etc. Regardless of the existence of such current systems, there also exists a need for a relatively inexpensive testing apparatus of relatively limited application designed to enable the majority of the above fault categories to be identified prior to the full functional testing of assembled printed circuit boards. This need stems from the fact that it has been found, primarily as a result of analysis of fault types, that by far the majority of functional faults originate as manufacturing defects such as those aforementioned. It has been found that an acceptance rate in excess of 90% can be obtained on full functional testing if a preliminary rudimentary fault location is effected based upon location of manufacturing defects.

FIGS. 1 and 2 of the accompanying drawings illustrate a known automatic fault location system. Referring to FIG. 1, the system briefly comprises a central processor unit 1 which, under the control of an operator unit 2, determines the connection of selected circuit nodes of a printed circuit board under test (B.U.T.) through an adapter 3 and a scanner switching matrix array 4 to a measuring unit 5. The adapter 3 comprises any convenient means such as a vacuum operated "bed-of-nails" type coupler for contacting selected circuit nodes of the B.U.T., and the matrix array 4 comprises a multiplicity of selectively addressable switches arranged as described hereinafter with reference to FIG. 2 and enabling the connection through the adapter 3 of any of the circuit nodes of the B.U.T. with a constant current source and/or a voltage measurement device in the measuring unit 5.

FIG. 2 illustrates the architecture of the scanner switching matrix array 4. As shown, a constant current source 10 and a differential voltmeter 11 constituting components of the measuring unit 5 are coupled via respective buses to a plurality of switching networks 12 each comprising four field effect transistors 13 and each providing a test point TP configurable either for current injection or for current reception in dependence upon a control input either to common connected gate 14 of FET pair 15 or to common connected gate 16 of FET pair 17 respectively. For example, in operation of the switching matrix for testing the value of a resistor connected between TP1 and TP2 by means of appropriate probes contacting the respective resistor terminals, a control input might be applied to gate 14 of FET pair 15 of switching network $12_1$ associated with TP1 so as to configure TP1 as a current injection node, and a control input might be applied to gate 16 of FET pair 17 of switching network $12_2$ associated with TP2 so as to configure TP2 as a current reception node. A current derived from current source 10 can then be applied through the resistor connected between TP1 and TP2, and the voltage developed across the resistor measured by means of voltmeter 11 coupled to TP1 and TP2 via the lower FET of FET pair 15 associated with network $12_1$ and the upper FET of FET pair 17 associated with network $12_2$ respectively.

The central processing unit 1 has the task, inter alia, of setting the control inputs to the gates of the FET pairs 15,17 in conjunction with timing the operations of the measuring unit 5, it being appreciated that the overall system function is essentially digital. Just as the resistance value of a resistor may be measured by injection of a current pulse and measuring the resultant voltage, so a capacitor may similarly be measured by measurement of the voltage to which the capacitor charges in response to the application of a current pulse for a determined time period. In similar manner, the viability of diodes and the inter-electrode characteristics of transistors can also be checked, as can also the viability of components in parallel and series-parallel resistor, capacitor and diode combinations by appropriate selection of current pulse characteristics (amplitude and duration particularly) and of measurement timings. It will be appreciated that the printed circuit board under test is powered-down in the course of the test so that the function of the overall board assembly is not being tested, but rather the viability and the in-tolerance value acceptability of individual and collective components on the board is tested.

Whilst the fault location system as above-described with reference to FIGS. 1 and 2 is a useful tool for the location of component faults in printed circuit board assemblies prior to full functional testing and, as aforementioned, can if remedial action is taken prior to full functional testing enhance the acceptability rate on functional testing very considerably, nonetheless it does have significant limitations as regards the scope of its capabilities. We have identified that these limitations stem from the predominantly unidirectional current conduction characteristics of the FET switches employed in its switching matrix array and, as will hereinafter be explained, we propose in accordance with one aspect of the present invention to make use of bidirectional switching arrangements in the switching matrix array which provides inter alia the advantage of enabling components to be subjected to alternating currents allowing impedances to be measured at different frequencies which leads to enhanced analysis of inductances and parallel and series-parallel networks using an impedance profiling technique whereby the impedance signature of a device or network, namely its characteristic response to a predetermined applied stimulation, can be monitored as a test of viability.

According to one aspect of the present invention therefore a fault location system for testing the viability of components on a printed circuit board or the like comprises a matrix array of bidirectionally current conducting analog switching networks each defining a test point for connection to a node of a board under test and connectable by control of the switching network either to a stimulus source or to a reference (e.g. ground) potential and simultaneously to a corresponding input of a measurement facility.

The fault location system according to the present invention is further characterised in relation to the prior art in that it advantageously comprises means enabling a plurality of stimulus sources to be selectively connected to the array of switching networks. Whereas in the prior art only a current source has been provided which is pulsed to provoke a voltage measurement, in accordance with the present invention both AC and DC current and voltage sources can be utilised to determine circuit board and component conditions.

The analog switching networks each preferably comprise four bidirectional analog transmission gates which could be configured as discrete field effect transistor circuits but preferably are in integrated circuit form. The four bidirectional analog transmission gates are commonly connected at one side to define the test point of the respective switching network and at their other sides define four terminals which constitute the input-/output terminals of the network. Furthermore, the control terminals of the four analog transmission gates are preferably connected together to define two control terminals for the network so that by application of an appropriate input to a respective one of the two network control terminals a respective two of the bidirectional analog transmission gates will be switched into conduction so as to connect the test point of the network firstly to the stimulus source and secondly to a respective input of the measurement facility. If the other of the network control terminals is addressed with an appropriate input, then conversely the test point of the network will be connected to ground and to a different input of the measurement facility.

The switching networks constructed of four bidirectional analog transmission gates thus will be appreciated to comprise four terminals each selectively connectable to a respective one of a stimulus source, a reference potential and two measurement nodes, a test point selectively connectable either to the stimulus source and a first of the measurement nodes or to the reference source and a second of the measurement nodes, and two network control terminals which determine which of the two different test point connections available through the network are realised.

According to another aspect of the invention there is provided an apparatus for testing circuit boards for manufacturing defects comprising a main body part and a plug-in-module removably insertable into the main body part, an interface connector comprising a pin matrix array mounted on the plug-in module and a connector matrix array mounted on the main body part providing for a plurality of connections between the plug-in module and the main body part, a circuit board receiving surface of the plug-in module having associated therewith a plurality of probes for simultaneously probing selected circuit nodes of a circuit board received thereon, and connections being provided between said probes and respective ones of the pins of said pin matrix array.

Various other aspects, features and advantages of the present invention are recited in the appended claims and will become apparent to the appropriately skilled reader from consideration of the following description of an exemplary embodiment of a system in accordance with the invention, such embodiment being illustrated in FIGS. 3 to 9 of the accompanying drawings wherein:

Figure 8:
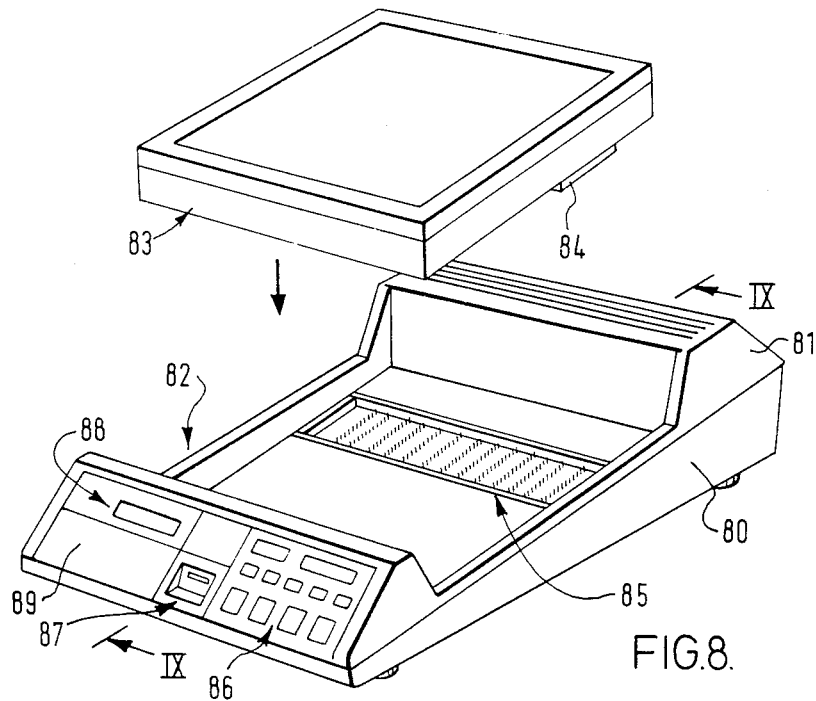
Figure 9:
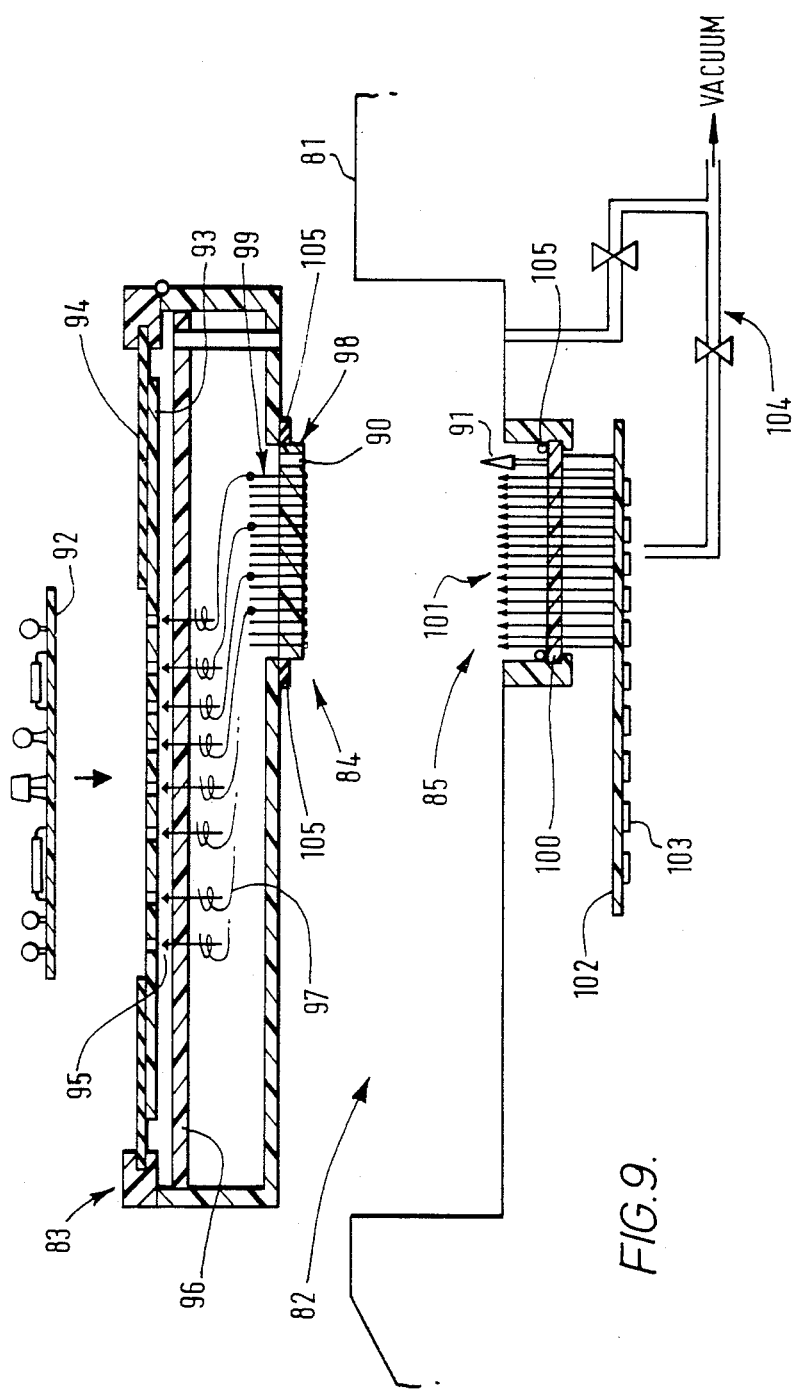

FIG. 8 schematically illustrates a possible physical arrangement of an automatic fault location system according to the present invention; and FIG. 9 is a schematic sectional view taken on the line IX . . . IX in FIG. 8.

Figure 1:
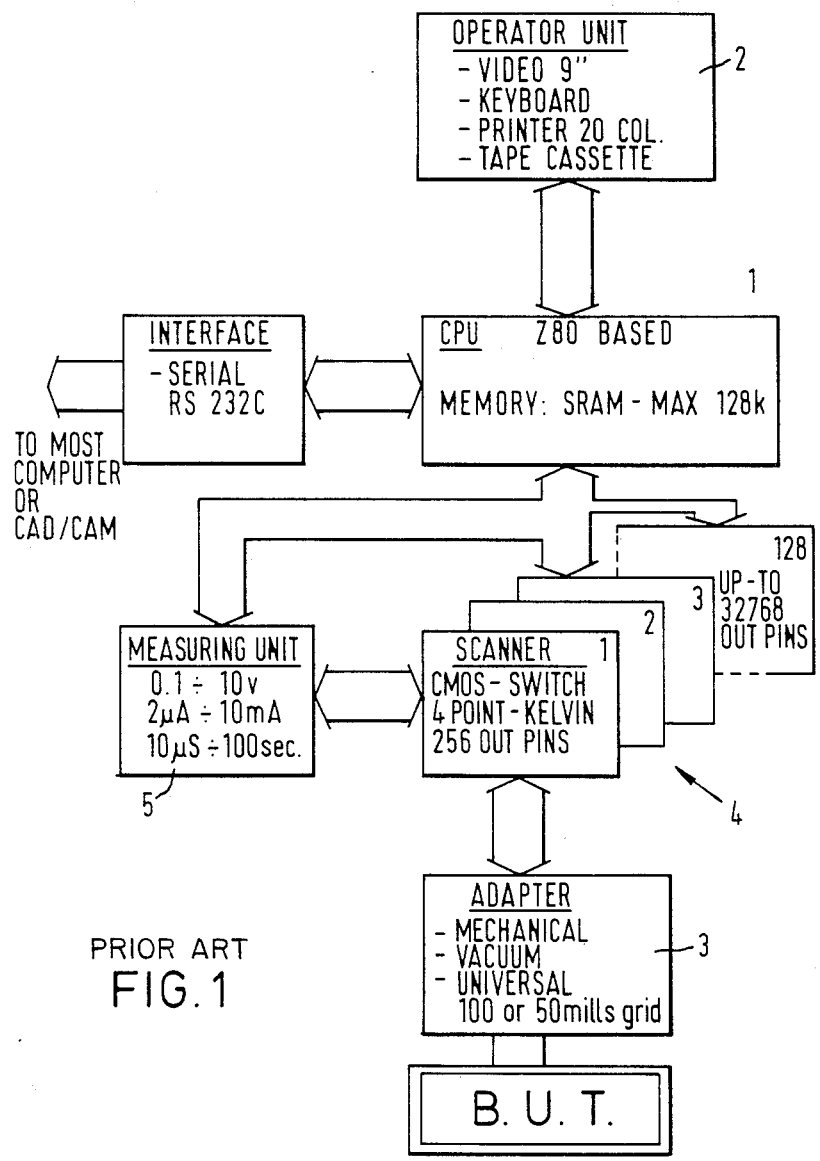

The hereinafter described embodiment of the present invention is designed to perform a function similar to that of the aforedescribed prior art system illustrated in FIGS. 1 and 2 of the accompanying drawings, but with enhanced capabilities stemming from the essentially bidirectional nature of the switching networks employed. Therefore, in the following description particular emphasis will be placed upon explaining the differences between the invention and the prior art, and features common to the invention and the prior art system will generally be mentioned only briefly if at all.

Figure 3:
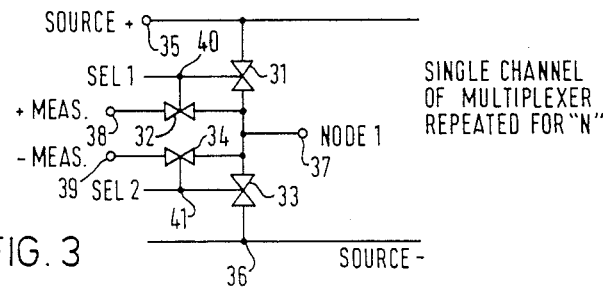
FIG. 3 is a schematic representation of a bidirectional switching network as employed in the system according to the present invention.

Referring to FIG. 3 which schematically illustrates a bidirectional switching network utilised in the performance of the invention, the network will be seen to comprise four bidirectional switches designated 31, 32, 33 and 34 interconnected as shown with each other and with source +, source −, test point (node) and two separate measurement terminals designated 35 to 39 respectively. Control terminals 40 and 41 also are provided respectively for determining the operation of the switches 31 and 32 and the switches 33,34. By selection of control terminal 40, for example, switches 31 and 32 can be rendered conductive so as to connect test point (node) 37 to the stimulation source +terminal 35 and to the "positive" measurement terminal 38. If control terminal 41 is selected, then switches 33 and 34 are enabled to connect the test point (node) 37 to the source −terminal 36 and to the "negative" measurement terminal 39.

It will be appreciated that the network shown in FIG. 3 is but one of a large number of parallel-connected networks each individually addressable via its control terminals to connect its respective test point (node) either to the stimulus source +terminal 35 and to measurement terminal 38 or to the source −(reference) terminal 36 and to measurement terminal 39. A component on a printed circuit board, for example a resistor whose resistance is to be verified as being within specified tolerances of its nominal value, can be contacted at one of its ends by means of a probe coupled to the test point (node) of any one switching network and can be contacted at its other end by means of a probe coupled to the test point (node) of any other switching network, and the two switching networks in question can be controlled by appropriate addressing of their control terminals so that one test point (node) coupled to one end of the resistor is coupled to the stimulus source (for example a constant current generator) and to one terminal of a voltage measurement device and the other test point (node) coupled to the other end of the resistor is coupled to ground and to another terminal of the voltage measurement device. A current pulse supplied from the stimulus source to ground via the resistor will set up a corresponding voltage across the resistor which can be measured by the voltage measurement device to enable the resistance value of the resistor to be computed and, as desired, compared with its nominal value to enable a decision to be taken as to whether or not its resistance value is within an acceptable tolerance range of the nominal value. As will be well understood, the addressing of the control terminals of the switching networks, the timing and the nature of the stimulus applications and of the measurements may advantageously be under computer control so that a multiplicity of components in a printed circuit board for example may be tested automatically in accordance with a preprogrammed routine.

Figure 2:
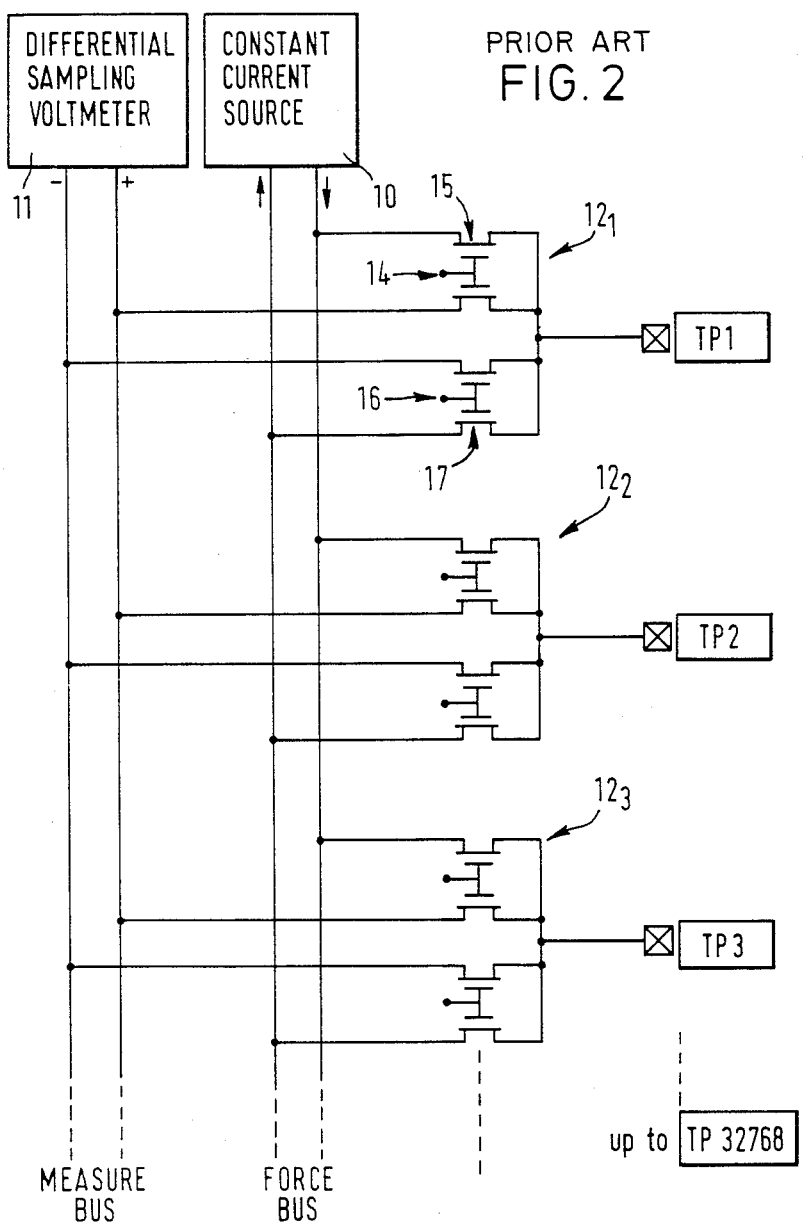
Figure 4:
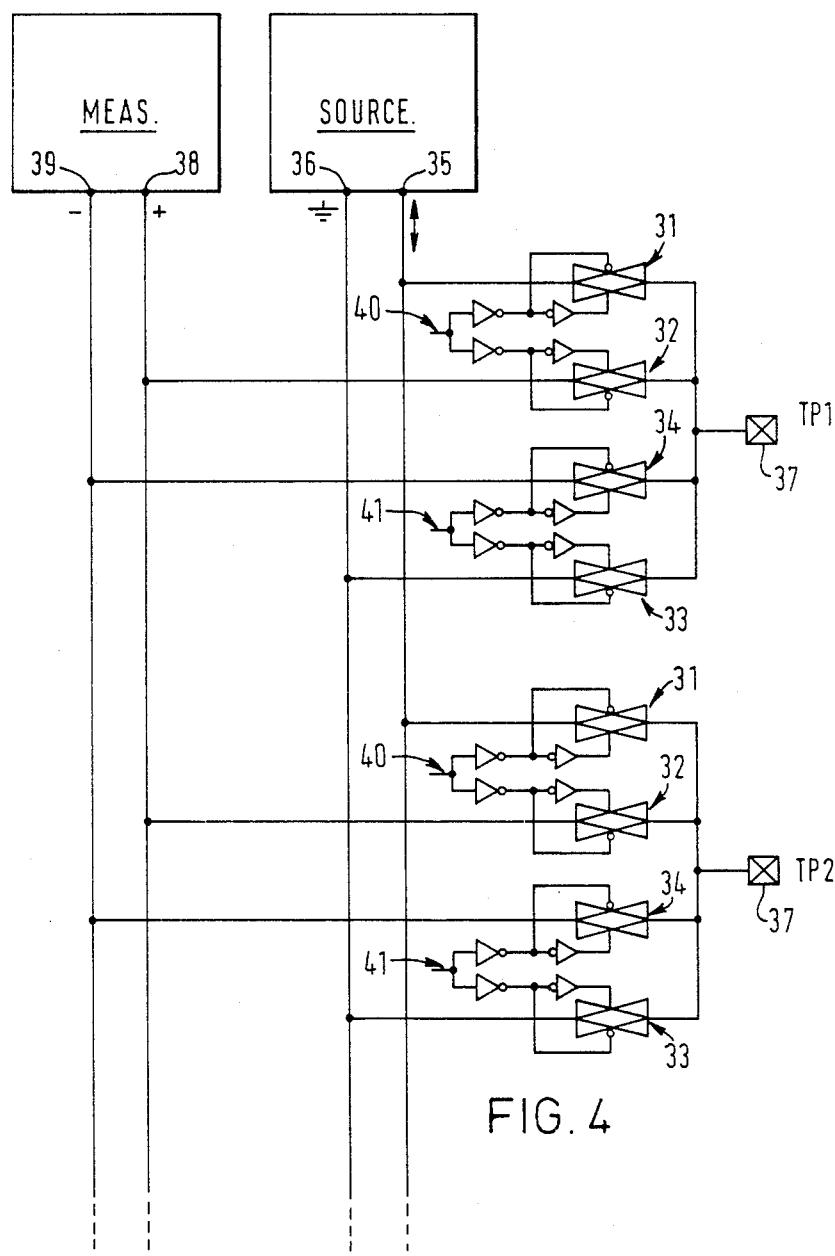
FIG. 4 is a more detailed showing of the network array of FIG. 3 depicted in a manner similar to the showing in FIG. 2 of the aforedescribed prior art system.

FIG. 4 shows, in a manner similar to the showing in FIG. 2 of a prior art switching network, the actual make-up of the switching network of FIG. 3 and the same reference numerals are used in FIG. 4 as are used to designate like parts in FIG. 3. As shown in FIG. 4 each of the switches 31,32,33,34 comprises a bidirectional analog transmission gate, and the four gates are connected as shown to define two control terminals 40 and 41 coupled via inverters to the gate electrodes of respective pairs of the gates 31,32,33,34.

With the arrangement shown in FIG. 4 and with a resistor, for example, to be tested coupled between test points TP1 and TP2, the application of an input to control terminal 40 of the switching network associated with test point TP1 such as to render switches 31 and 32 of that network bidirectionally conductive, and the application of a corresponding input to control terminal 41 of the switching network associated with test point TP2 such as to render switches 33 and 34 of that network bidirectionally conductive, will enable a current pulse to be passed through the resistor and the corresponding voltage developed across the resistor to be measured between measurement nodes 38 and 39. In similar manner, other components such as capacitors, inductors, diodes, transistors etc. can be tested by application of selected current/voltage/frequency stimuli and/or combinations thereof and observation of the resultant current/voltage response of the respective components.

Figure 5:
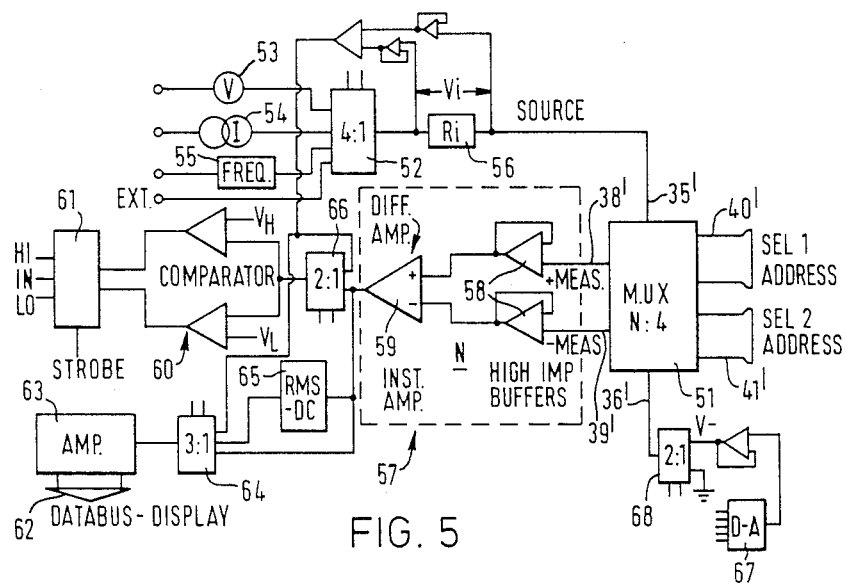
FIG. 5 is a partial circuit diagram of an exemplary embodiment of the invention.

FIG. 5 shows the general circuit arrangement of an exemplary system according to the present invention. Reference numeral 51 designates a multiplexer comprising a plurality of the switching networks described above with reference to FIGS. 3 and 4, the multiplexer 51 having associated therewith address buses designated 40' and 41' for computer controlled addressing of the control terminals 40 and 41 of the switching networks and further having terminals 35',36',38', and 39' corresponding respectively to the source +terminal 35, the source −(reference) terminal 36, and the respective measurement terminals 38 and 39 of the switching networks. For minimising the number of connections required between the controlling computer and the control terminals 40 and 41 of the switching networks, it being appreciated that in a practical embodiment of the invention there may typically be several thousand such control terminals to be selectively addressed, it is preferred that serial-to-parallel conversion techniques are employed in the address buses. The source terminal 35' is selectively connectable via a switching device 52 controllable from the central processing unit (not shown) of the system with voltage, current and frequency sources 53, 54 and 55 respectively all comprising integral parts of the system, and with an external terminal. A standard resistor 56 in the voltage source line enables high value resistors to be measured. The measurement terminals 38', 39' of the multiplexer 51 are coupled to an instrumentation amplifier generally designated 57 comprising high impedance buffers 58 and a differential amplifier 59, and the output of the instrumentation amplifier 57 is coupled via a two way switch 66 to a window comparator arrangement 60 for comparison with "high" and "low" reference levels $V_H$ and $V_L$ in order to provide corresponding inputs to logical circuitry 61 providing "high", "in" or "low" outputs representative of the relationship of the measured value of the component in question to a predetermined tolerance range associated with an acceptable component.

The output of the instrumentation amplifier 57 is also applied to a display databus 62 via an analog-to-digital converter 63 fed via a switching device 64 controllable from the central processing unit with either the direct output of the instrumentation amplifier 57 or with the output of an RMS-DC converter 65. The switch 64 is also connected to receive a signal representative of the voltage $V_i$ derived across test resistor 56 aforementioned in order to measure source currents.

A digital-to-analog converter 67 enables a negative reference voltage V− to be selectively applied via two way switch 68 to the reference terminal 36' of multiplexer 51, the D-A converter 67 and the switch 68 being controllable from the central processing unit of the apparatus.

Figure 6:
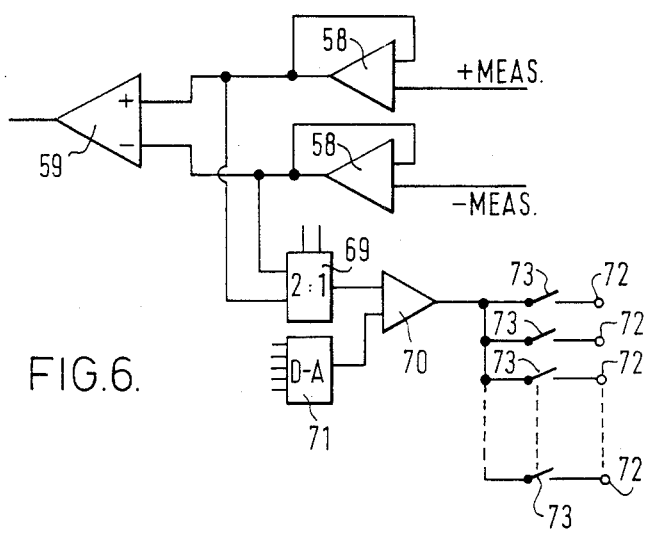
FIG. 6 shows a modification of the circuit diagram of FIG. 5.

FIG. 6 shows a modification of the circuit of FIG. 5 designed to enable measurement of the gain of a discrete transistor to be effected and also to enable so-called guarding techniques to be employed in the analysis of multiple component networks. As shown, the outputs of the buffer amplifiers 58 of FIG. 5 are additionally applied via a selector 69 to a summing amplifier 70 for summing with the output of a digital-to-analog converter 71 in order to derive an additional stimulus signal to be applied selectively to the circuit nodes 72 by selective operation of the relays 73. In use of such an arrangement to check the gain of a discrete transistor, the emitter and collector of the transistor are probed by respective ones of the circuit nodes 37 shown in FIG. 3 (that is, for example, by test points TP1 and TP2 shown in FIG. 4) and the base of the transistor is probed by means of one of the additional nodes 72 selected by operation of a respective one of the relays 73. With the emitter and collector voltages of the transistor appropriately set at the nodes 37 and with the selector 69 set in accordance with whether the transistor is an NPN or a PNP transistor, the digital-to-analog converter 71 provides an added current value enabling the base conditions to be established for determining the gain of the transistor.

The modified circuit arrangement of FIG. 6 also enables measurements to be made by means of a guarding technique. For example, if a resistor R1 was connected between TP1 and TP2 in FIG. 4 and series connected resistors R2 and R3 were also connected between TP1 and TP2 in parallel with resistor R1, the circuit arrangement of FIG. 5 would not enable the value of R1 alone to be determined on account of the effect of parallel connected R2 and R3. However, with the arrangement of FIG. 6 and by coupling of the junction of R2 and R3 to one of the test nodes 72 the potential can be equalised on either side of R2 (or R3) thereby effectively isolating R1 and enabling its value to be measured. In this way, resistor R1 is guarded from the effects of parallel-connected series resistors R2 and R3.

Figure 7:
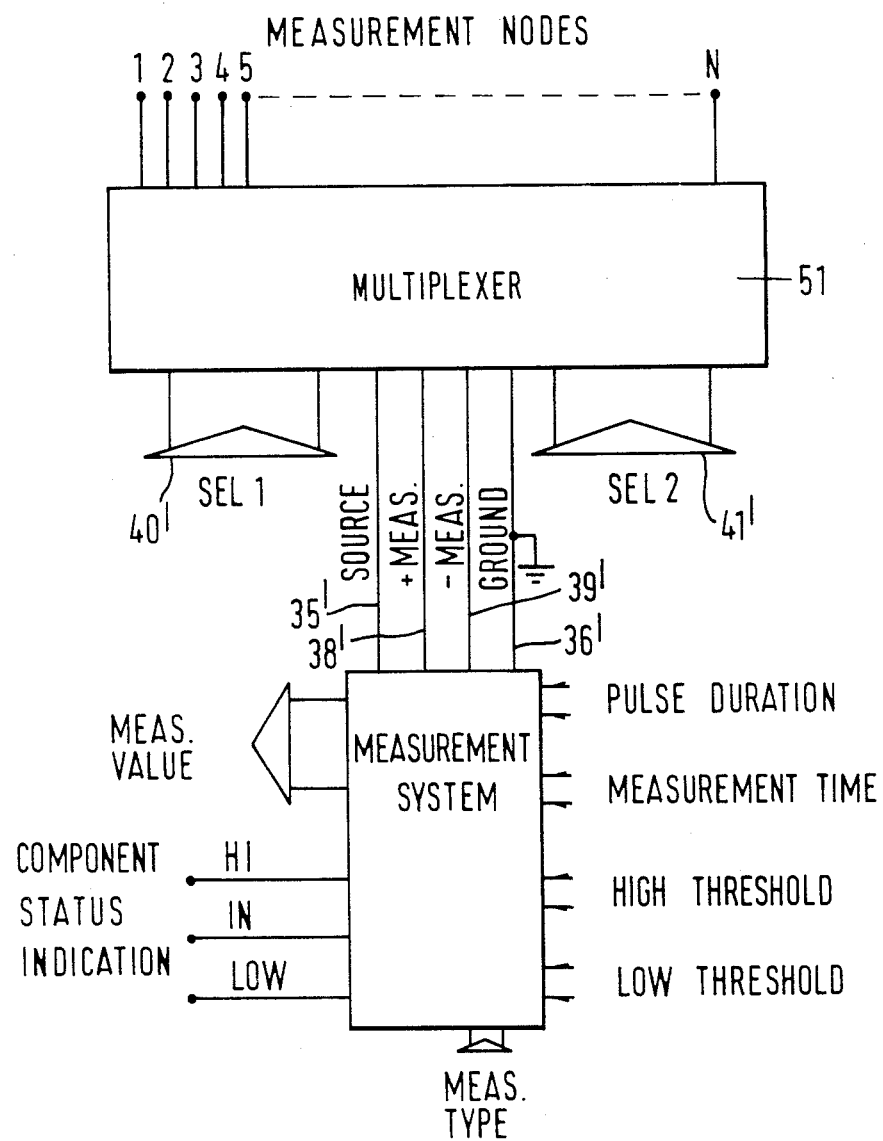
FIG. 7 is a schematic block diagram which illustrates the testing philosophy of the embodiments of FIGS. 5 and 6.

FIG. 7 is a general representation of a system according to the present invention useful for an understanding of the philosophy underlying the inventive system. The multiplexer 51 above described is shown providing a plurality of measurement nodes 1,2,3 ... N, as well as the control terminal selection input buses 40',41', and the source, reference (ground) and two measurement nodes 35',36',38' and 39' aforementioned. The measurement system, designated 60, as more particularly described with reference to FIGS. 5 and 6 responds to input data from the central processing unit (not shown) of the system regarding the measurement type (e.g. voltage stimulus, current stimulus, frequency stimulus), the duration of any stimulus pulse to be employed, the time at which any measurement is to be effected, and high and low thresholds to be compared with measured values, and as the result of a measurement effected upon a component is capable of providing measured value outputs and a component status indication.

FIG. 8 is a perspective view of an exemplary fault location apparatus constructed in accordance with the present invention and FIG. 9 is a partial sectional view taken on the line IX ... IX in FIG. 8. Referrring initially to FIG. 8, the apparatus is adapted for desk-top or table-top use and comprises a moulded aluminium base 80 and a moulded plastic cover 81 defining a housing formed with a central recess 82 adapted to receive a module 83 which, as will be described hereinafter, is customised for the particular circuit to be tested and has on its underside an interface connector 84 adapted to mate with a complementary connector 85 provided in the bottom of the recess 82. The housing defined by the base 80 and cover 81 contains the electronic circuits and other components of the apparatus and, as shown, the cover 81 has an inclined front face which serves as a mounting for a control panel 86 preferably utilising membrane type switches, a paper roll printer 87, and an LCD display 88 for displaying operator commands etc. A flip-up lid 89 provides access to hard and/or floppy disc drives.

The module 83 is constructed as a rigid rectangular box of precise dimensions adapted to fit closely within the recess 82, though not so closely that the complementary connector parts 84,85 cannot adjust for precise positioning relative to each other, there being provided in the connector part 84 a pair of spaced-apart precisely formed and precisely positioned bores 90 (one of which can be seen in FIG. 9) and there being provided in the connector part 85 a correspondingly precisely located positioning member 91 (see FIG. 8) comprising a conical head portion mounted on a relatively rigid shaft mounted in an oil dash-pot. As the connector parts 84,85 are moved towards each other, the conical head of the member 91 engages in the bore 90 and thereafter guides the two connector parts into precisely controlled positional interrelationship with each other.

Referring now to FIG. 9 which is an enlarged sectional view on the line IX ... IX of FIG. 8, reference numeral 92 designates a circuit board to be tested adapted to be received upon an insulating carrier plate 93 which is mounted in the module 83 of the apparatus by means of a flexible diaphragm 94, the carrier plate 93 being apertured correspondingly to the positions of a plurality of spring loaded probe pins 95 secured in a detachable insulating bed plate 96, the positions of the pins 95 in the plate 96 being determined in accordance with the arrangement of the circuit board 92 so that when, in response to a vaccum established within the depicted apparatus, the circuit board 90 is drawn down with flexure of the diaphragm 94 towards the bed plate 96 the pins 95 contact the circuit nodes of the printed circuit board 92. The arrangement for establishing the requisite vacuum within the apparatus so as to pull down the circuit board 92 onto the pins 95 is only schematically illustrated, but will be well understood by those who are appropriately skilled.

The pins 95 in the bed plate 96 are wire wrapped with respective connecting leads 97 coupled to selected pins of a pin matrix array formed in the first connector part 84 which comprises an insulating plastic support 98 with a plurality of rows of terminal pins or "nails" 99 mounted therein as shown with their shanks projecting from the upper surface of the support 98 and their heads flush with the under side. There might, for example, be several thousand pins 99 in the thus described pin matrix array comprising connector part 84. The cooperating connector part 85 comprises an insulating plastics support 100 which serves as a mounting for a connector matrix comprising a plurality of rows of connector pins 101 each with a spring-loaded head portion contactable by the head portion of a respective one of the pins 99 of the matrix array provided in connector part 84. The pins 101 of the connector matrix extend through correspondingly located holes of a printed circuit board 102 and are connected on the underside of the board 102 with surface mounted integrated circuit devices 103 constituting the electronic circuitry of the system as hereinbefore described with reference to FIGS. 3 to 6, and particularly the switching networks of FIG. 3, such devices being mounted directly on the board 103 between the rows of pins 101 and thus having minimal lead lengths with consequent advantages as regards minimising of stray resistance, capacitance and inductance.

The arrangement of FIGS. 8 and 9 is particularly convenient in that the bed plate 96 and the pin matrix array of connector part 84 can readily be customised for any particular circuit board to be tested, and no other adaptation of the apparatus is required to convert the apparatus for the testing of a different circuit board, it being appreciated that the pin configuration established at the pin matrix array of connector part 84 determines the connections made at the connector matrix of connector part 85 which in turn determines which of the measurement nodes 1 to N of the multiplex switching circuit array 51 of FIGS. 5 to 7 are available for operation in the testing of any particular printed circuit board.

The arrangement of FIGS. 8 and 9 utilises a vacuum for drawing the circuit board to be tested down onto the probe pins 95 and will require the provision of vacuum supply arrangements 104 and seals 105 which are schematically and exemplarily shown in FIG. 9. Whilst such a vacuum powered arrangement is preferred, nonetheless the circuit board being tested could be urged by mechanical means into contact with the probe pins.

There has thus been described a fault location system useful for screening printed circuit boards and the like prior to full functional testing of the same in order to locate out of tolerance components, improperly wired components (e.g. diodes connected in the wrong direction), missing components, wiring faults (e.g. "dry" soldered connections) and the like. Not only does the system according to the invention enable such fault location operations to be carried out, as in the prior art, by application of a pulse from a constant current source and measurement of the voltage response, as appropriate at a particular time, but also by virtue of its use of bidirectionally current conducting switching devices the system of the invention enables a.c. stimuli to be used, either alone or in combination with d.c. stimuli, which as has been mentioned hereinbefore, enables impedances to be measured at frequencies with consequent advantages as regards the analysis of inductances and parallel networks by an impedance profiling (signature recognition) technique. Coupled with its inclusion of a central processing unit (microcomputer) which organises the generation of appropriate stimuli, the application of the generated stimuli to the circuit nodes of the board under test, the collection of response data, and the analysis of the response data for providing the required fault location, the present invention provides a powerful and yet cost efficient production aid.

As will be appreciated by those skilled in the art, a manufacturing defects analyser in accordance with the present invention could be used with the automatic test equipment disclosed in our British Patent Application No. 8429657 filed 23rd Nov. 1984, the manufacturing defects analyser constituting one of the modules of the automatic test equipment.

We claim:

1. A fault location system for testing the viability of components on a printed circuit board under test, said system comprising an array of bidirectionally current conducting analog switching networks each of said switching networks connected to a test point suitable for connection to a node of said printed circuit board, a stimulus source means for selective application of stimuli to components on said printed circuit board, a measurement facility selectively connectable to enable the response of components on said printed circuit board to said stimuli to be measured, means for establishing a source of reference potential, and control means arranged to control the switching networks so as selectively to connect said test points either to said stimulus source or to said reference potential source and simultaneously also to a corresponding input of said measurement facility, said switching networks each comprising four bidirectionally current conducting solid-state analog switches each having a control electrode addressable by said control means for determining the current conduction condition of the respective switch, a first of said switches in each said switching network having its current conduction path connected between a terminal of said stimulus source and the respective test point and its control electrode connected to a first selection terminal of the control means, a second of said switches in each said switching network having its current conduction path connected between said test point and a terminal of said reference potential source and its control electrode connected to a second selection terminal of the control means, a third of said switches in each said switching network having its current conduction path connected between said test point and a first terminal of said measurement facility and its control electrode connected to a third selection terminal of the control means, and a fourth of said switches in each said switching network having its current conduction path connected between said test point and a second terminal of said measurement facility and its control electrode connected to a fourth selection terminal of the control means.

2. A system as claimed in claim 1 wherein said first and said third selection terminal are commonly connected, and said second and said fourth selection terminal are commonly connected.

3. A system as claimed in claim 1 wherein said switches each comprise a bidirectional analog transmission gate.

4. A system as claimed in claim 1 wherein a multiplexer is provided for connecting said stimulus source and reference potential terminals and said first and second measurement terminals selectively to said switching networks, and wherein, for enabling the gain of a transistor to be evaluated, a switch means is provided for selecting the output on one or other of said measurement terminals according to the polarity type of the transistor, means are provided for combining with the selected measurement terminal output an added current for developing a base input to the transistor, and a plurality of selectable additional test points are provided for applying said base input to the base of a transistor having its emitter and collector coupled to the test points established by respective ones of said switching networks.

5. A system as claimed in claim 1 including data processing means coupled to said array of switching networks for providing control inputs thereto for selectively determining the condition of the switching network associated with each test point.

6. A system as claimed in claim 1 including switch means enabling a plurality of stimulus sources to be selectively coupled to the array of switching networks.

7. A system as claimed in either claim 5 or 6 wherein the operation of said switch means is determined by said data processing means.

8. A system as claimed in claim 7 wherein said plurality of stimulus sources comprises at least a DC voltage source, a constant current source, and a variable frequency signal generator.

9. A system as claimed in claim 1 wherein said measurement facility comprises means for providing an indication as to the relationship of a measured value of a component to a predetermined tolerance range.

10. A system as claimed in claim 1 wherein said measurement facility comprises means to enable the production of a display of the reaction of a tested component or group thereof to a test stimulus.

11. A system as claimed in claim 1 wherein said measurement facility comprises signature recognition means responsive to the application to a component or component combination under test of a predetermined stimulus combination to recognise a corresponding response indicative of an acceptably operative component or combination thereof.

12. A system as claimed in claim 1 which comprises a plurality of probe members arranged for making contact with the circuit nodes of a printed circuit board, a pin matrix array comprising a plurality of pins mounted in an electrically insulating carrier, means connecting said probe members each to a selected one of said pins, a connector matrix comprising a plurality of connector pins including pins arranged to be contacted by respective ones of said pins of said pin matrix array, and means connecting said connector pins to respective ones of the test points defined by said array of switching networks.

13. A system as claimed in claim 12 wherein the pins of said connector matrix are mounted in a plurality of rows on a printed circuit board or the like and said switching networks are comprised by integrated circuit devices mounted between said rows and connected to said pins.

14. A system as claimed in claim 12 or 13 wherein said plurality of probe members are mounted in a first apparatus part serving also as a mounting for said pin matrix array, and said connector matrix is mounted in a second apparatus part, the arrangement being such as to enable different arrangements of said probe members and of said pin matrix array to be selectively assembled with said first apparatus part in the testing of different printed circuit boards and to be assembled in operative relationship with said second apparatus part without necessitating any modification of the second apparatus part.

15. A system as claimed in claim 14 wherein said first apparatus part comprises a modular component adapted to be received in an accommodating recess in said second apparatus part in such a manner that the insertion of said modular component into said recess causes the pins of said pin matrix array to come into contact each with a respective one of the pins of said connector matrix.

16. A system as claimed in claim 15 wherein said first apparatus part comprises a rigid rectangular housing having an upper surface defining a receptor surface for a circuit board to be tested, said receptor surface being movable so as to translate a circuit board to be tested received thereon in a direction towards the interior of said housing, said plurality of probe members comprising spring-loaded probe pins mounted in an insulating carrier underlying said receptor surface in a pattern adapted for contacting predetermined circuit nodes of said circuit board as said circuit board is thus translated, said pin matrix array being mounted in a surface of said housing opposite to said receptor surface with said pins projecting inwardly of said housing and having head portions accessible from the exterior of said housing, and a plurality of conductors interconnecting said probe pins to selected ones of said pins of said pin matrix array where they project inwardly of said housing, and said second apparatus part comprises a housing having an upper surface wherein there is provided a recess dimensioned to accept said first apparatus part and having a bottom surface wherein said connector matrix is mounted for interfacing with said pin matrix when the first apparatus part is inserted into said recess, said connector matrix comprising a plurality of spring-loaded pins each adapted for contacting the head portion of a respective one of the pins of the pin matrix provided in the first apparatus part.

17. A system as claimed in claim 16 wherein cooperating means are provided on said pin matrix array and on said connector matrix array for bringing the same into precisely predetermined positional relationship as they are brought together when the first apparatus part is inserted into the recess in the second apparatus part, said cooperating means including a pair of conical members each adapted to engage with a respective one of a pair of bores.

18. A system as claimed in claim 1 wherein, for enabling a circuit borad under test to be electrically connected to test equipment, said system further comprises a plurality of electrical probes engageable with respective circuit nodes of a circuit board to be tested, the arrangement of the probes in a carrier having been determined in conjunction with the layout of the circuit boad to effect such engagement when the circuit board and the carrier are brought into predetermined juxtaposition with each other, a pin matrix array comprising a plurality of terminal pins mounted in an electrically insulating support, means connecting said probes to respective ones of said terminal pins, a connector matrix comprising a plurality of connector terminals mounted in an electrically insulating support, each of said connector terminals being arranged to be contacted by a respective one of said terminal pins when the pin matrix array and the connector matrix are brought into predetermined juxtaposition with each other, said connector terminals being mounted in a printed circuit board or the like and integrated circuit devices constituting said test equipment or parts thereof being mounted on said circuit board or the like and being coupled with said connector terminals, the arrangement thereby ensuring a short lead length between said connector terminals and said integrated circuit devices.

19. A system according to claim 18, which comprises a first modular apparatus part and a second apparatus part formed with a recess for receiving said first modular part, said first modular part having a receptor surface for a circuit borad to be tested and means for effecting relative translation between a circuit board on said receptor surface and said plurality of probes for engaging said probes with circuit nodes of said circuit board, said probes being spring-loaded and said pin matrix array being mounted in a further surface of said first modular apparatus part with head portions of said pins accessible at said further surface for engagement with respective ones of said connector terminals of said connector matrix, said second apparatus part having said connector matrix mounted in a surface of said recess and said connector matrix comprising a plurality of spring-loaded terminal pins mounted in an insulating carrier.

20. A system as claimed in claim 1 which comprises a housing part containing stimulus and reference sources and said measurement facility and further containing data processing means operable under software control for determining the operation of said switching networks, and the circuit board to be tested being adapted to be received on a receptor surface of a modular unit which is adapted to be removably received in a recess in said housing, said receptor surface having associated therewith a plurality of probes for probing circuit nodes of the circuit board, and a two-part interface connector being provided with one part on said modular unit and the other part on said housing part in said recess, said one connector part comprising a pin matrix array wherein selected pins are coupled to respective ones of said probes, and said other connector part comprising a connector matrix array wherein each connector is adapted to engage with a respective one of the pins of the pin matrix array when the modular unit is inserted into the housing recess, each said connector constituting a test point and being coupled to a respective one of said switching networks.

21. A system as claimed in claim 1 which further comprises a housing defining a recess for receiving a circuit board receptor module; a circuit board receptor module removably received in said recess; said circuit board receptor module having a receptor surface for receiving a circuit board thereon and further comprising a plurality of electrical probes mounted in an insulating carrier in an arrangement which is predetermined for probing circuit nodes of the circuit board, and a first interface connector part comprising a pin matrix array wherein selected ones of the pins are connected to respective ones of said probes, said first interface connector part being accessible from outside of said receptor module; said recess having provided therein a second interface connector part comprising a connector matrix array having a plurality of connector pins each engageable with a respective one of the pins of the said pin matrix array when the circuit board receptor module is received in the said recess; each of said connector pins constituting a test point of the apparatus for connection via the pins of the first interface connector part to a node of a circuit board under test; said array of bidirectionally current conducting switching networks being provided in said housing and each being coupled to a respective one of said connector pins and enabling the same to be connected selectively to either said stimulus source or said reference potential and simultaneously also to an input of said measurement facility; means in said housing for establishing said stimulus source and said reference potential and for providing said measurement facility; and data processing means in said housing for providing software controlled inputs to said switching networks for selectively determining the condition of the switching networks coupled via said first and second interface connector parts and via said probes to the circuit nodes of a circuit board under test so as to apply predetermined electrical sitmuli to circuit components coupled to said nodes for determining the viability of such components.

\* \* \* \* \*

UNITED STATES PATENT AND TRADEMARK OFFICE
CERTIFICATE OF CORRECTION

PATENT NO. : 4,714,875
DATED : December 22, 1987
INVENTOR(S) : Bailey et al.

It is certified that error appears in the above—identified patent and that said Letters Patent is hereby corrected as shown below:

Title page:

In the Abstract:

Line 10, delete "switchng" and insert --switching--.

In the Claims:

Claim 18, column 11, line 66, delete "borad" and insert --board--.

Claim 18, column 12, line 4, delete "boad" and insert --board--.

Claim 19, column 12, line 27, delete "borad" and insert --board--.

Claim 20, column 12, line 42, insert --said-- following "containing".

Signed and Sealed this

Third Day of April, 1990

Attest:

HARRY F. MANBECK, JR.

Attesting Officer

Commissioner of Patents and Trademarks